United States Patent
Tao

(10) Patent No.: US 11,322,108 B2
(45) Date of Patent: May 3, 2022

(54) GOA CIRCUIT INCLUDING A REVERSE CIRCUIT AND A POTENTIAL HOLDING CIRCUIT AND DISPLAY PANEL

(71) Applicant: Wuhan China Star Optoelectronics Technology Co., Ltd., Hubei (CN)

(72) Inventor: Jian Tao, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 112 days.

(21) Appl. No.: 16/766,748

(22) PCT Filed: Mar. 17, 2020

(86) PCT No.: PCT/CN2020/079649
§ 371 (c)(1),
(2) Date: May 26, 2020

(87) PCT Pub. No.: WO2021/159579
PCT Pub. Date: Aug. 19, 2021

(65) Prior Publication Data
US 2022/0005431 A1    Jan. 6, 2022

(30) Foreign Application Priority Data
Feb. 12, 2020  (CN) .......................... 202010088163.5

(51) Int. Cl.
*G09G 3/36* (2006.01)

(52) U.S. Cl.
CPC ................... *G09G 3/3677* (2013.01)

(58) Field of Classification Search
None
See application file for complete search history.

(56) References Cited

U.S. PATENT DOCUMENTS

2016/0189649 A1*  6/2016  Xiao ................... G09G 3/3677
                                             345/214
2019/0147821 A1    5/2019  Tagawa et al.
2021/0193000 A1*  6/2021  Ma ....................... G06F 3/0412

FOREIGN PATENT DOCUMENTS

CN            110047447        7/2019

* cited by examiner

*Primary Examiner* — Kirk W Hermann

(57) ABSTRACT

A gate driver of array (GOA) circuit includes a plurality of cascaded GOA units, wherein an N-th GOA unit includes a scan control circuit, a reverse circuit, a gate signal output circuit, and a potential holding circuit. The reverse circuit is coupled to the scan control circuit. The gate signal output circuit is coupled to an Nth clock signal, the scan control circuit, and the reverse circuit. The potential holding circuit is coupled to the scan control circuit, the reverse circuit, and the gate signal output circuit.

17 Claims, 5 Drawing Sheets

GOA CIRCUIT INCLUDING A REVERSE CIRCUIT AND A POTENTIAL HOLDING CIRCUIT AND DISPLAY PANEL

RELATED APPLICATIONS

This application is a National Phase of PCT Patent Application No. PCT/CN2020/079649 having International filing date of Mar. 17, 2020, which claims the benefit of priority of Chinese Patent Application No. 202010088163.5 filed on Feb. 12, 2020. The contents of the above applications are all incorporated by reference as if fully set forth herein in their entirety.

FIELD AND BACKGROUND OF THE INVENTION

The present disclosure relates to the technical field of displays, especially to the technical field of driving pixels, and specifically to a gate driver on array (GOA) circuit and a display panel having the GOA circuit.

A gate driver on array (GOA) circuit is a row-scanning gate driving signal circuit, which is fabricated on an array substrate by adopting current manufacturing process for an array in a thin film transistor liquid crystal display, in order to implement the driving technology for a gate progressive scan.

When touch and display driver integration (TDDI) products are detected for touch signals, touch time is generally set between 200 microseconds and 300 microseconds. During this period, displaying function needs to be paused. That is, transmission of cascaded signals in the GOA circuit is suspended, and a clock signal used for the GOA circuit is set to low. At the same time, potential at a pull-up node in the GOA circuit needs to be maintained, in order to wait for the end of a touch phase and to meet a high level in the clock signal. However, in current GOA circuit, there is leakage during the touch phase, and the potential at a key node is not easy to maintain, which causes that a gate-driving waveform output from the GOA circuit is seriously distorted, resulting in abnormal display.

SUMMARY OF THE INVENTION

The present disclosure provides a gate driver on array (GOA) circuit, which solves a problem of that potential at a key node in the GOA circuit is not easy to maintain during a touch phase, which causes that a gate-driving waveform output by the GOA circuit is seriously distorted.

in a first aspect, the present disclosure provides a GOA circuit, which includes a plurality of cascaded GOA units, wherein an N-th GOA unit includes a scan control circuit, a reverse circuit, a gate signal output circuit, and a potential holding circuit; the scan control circuit is configured to control a first driving signal being coupled with a constant high-potential voltage signal or a constant low-potential voltage signal according to an (N−1)th gate-driving signal and an (N+1)th gate-driving signal; the reverse circuit is coupled to the constant high-potential voltage signal, the constant low-potential voltage signal, and the scan control circuit, wherein the reverse circuit is configured to output a second driving signal according to the first driving signal; the gate signal output circuit is coupled to an N-th clock signal, the constant low-potential voltage signal, the scan control circuit, and the reserve circuit, wherein the gate signal output circuit is configured to output an N-th gate-driving signal according to the first driving signal and the second driving signal; and the potential holding circuit is coupled to the constant high-potential voltage signal, the constant low-potential voltage signal, the scan control circuit, the reverse circuit, and the gate signal output circuit, wherein the potential holding circuit is configured to output a third driving signal according to the first driving signal and the second driving signal, and the third driving signal is coupled with the first driving signal; wherein the N is a positive integer.

Combining the first aspect, in a first embodiment of the first aspect, the reverse circuit includes a first inverter and a second inverter; the first inverter is coupled to the constant high-potential voltage signal, the constant low-potential voltage signal, and the scan control circuit, wherein the first inverter is configured to output a fourth driving signal according to the first driving signal; and the second inverter is coupled to the constant high-potential voltage signal, the constant low-potential voltage signal, the scan control circuit, and the first inverter, wherein the second inverter is configured to output the second driving signal according to the first driving signal and the fourth driving signal.

Combining the first embodiment of the first aspect, in a second embodiment of the first aspect, the scan control circuit includes a first transistor and a second transistor; wherein the constant high-potential voltage signal is coupled to a drain of the first transistor; the (N−1)th gate-driving signal is coupled to a gate of the first transistor; the constant low-potential voltage signal is coupled to a drain of the second transistor; the (N+1)th gate-driving signal is coupled to a gate of the second transistor; and a source of the first transistor and a source of the second transistor are coupled and output the first driving signal.

Combining the second embodiment of the first aspect, in a third embodiment of the first aspect, the first inverter includes a third transistor and a fourth transistor; wherein the constant high-potential voltage signal is coupled to a drain of the third transistor and a gate of the third transistor; a source of the third transistor and a drain of the fourth transistor are coupled and output the fourth driving signal; the source of the first transistor is coupled to a gate of the fourth transistor; and a source of the fourth transistor is coupled to the constant low-potential voltage signal.

Combining the third embodiment of the first aspect, in a fourth embodiment of the first aspect, the second inverter includes a fifth transistor and a sixth transistor; wherein the constant high-potential voltage signal is coupled to a drain of the fifth transistor; the source of the third transistor is coupled to a gate of the fifth transistor; a source of the fifth transistor and a drain of the sixth transistor are coupled and output the second driving signal; the source of the first transistor is coupled to a gate of the sixth transistor; and the constant low-potential voltage signal is coupled to a source of the sixth transistor.

Combining the fourth embodiment of the first aspect, in a fifth embodiment of the first aspect, the potential holding circuit includes a seventh transistor, an eighth transistor, and a ninth transistor; wherein the source of the first transistor is coupled to a gate of the seventh transistor; the constant high-potential voltage signal is coupled to a drain of the seventh transistor and a gate of the ninth transistor; a source of the seventh transistor is coupled to a drain of the ninth transistor and a drain of the eighth transistor; the drain of the sixth transistor is coupled to a gate of the eighth transistor; the constant low-potential voltage signal is coupled to a source of the eighth transistor; and a source of the ninth transistor and the source of the first transistor are coupled and output the third driving signal.

Combining the fifth embodiment of the first aspect, in a sixth embodiment of the first aspect, the gate signal output circuit includes a tenth transistor and an eleventh transistor; wherein the N-th clock signal is coupled to a drain of the tenth transistor; the source of the ninth transistor is coupled to a gate of the tenth transistor; a source of the tenth transistor and a drain of the eleventh transistor are coupled and output the N-th gate-driving signal; the drain of the sixth transistor is coupled to a gate of the eleventh transistor; and the constant low-potential voltage signal is coupled to a source of the eleventh transistor.

Combining the sixth embodiment of the first aspect, in a seventh embodiment of the first aspect, each of the first transistor, the second transistor, the third transistor, the fourth transistor, the fifth transistor, the sixth transistor, the seventh transistor, the eighth transistor, the ninth transistor, the tenth transistor, and the eleven transistor is an NMOS thin film transistor.

Combining the first aspect, in an eighth embodiment of the first aspect, when the N is equal to 1, the (N−1)th gate-driving signal is an enabling signal that is configured to enable a first GOA unit to operate.

In a second aspect, the present disclosure provides a display panel, which includes a GOA circuit in any one of the above embodiments.

The present disclosure provides the GOA circuit, in which the third driving signal output by the potential holding circuit and the first driving signal form a self-feedback loop. During a touch phase, the potential holding circuit can supply and maintain potential of the first driving signal, in order to ensure that the GOA circuit outputs a normal waveform of the gate-driving signal.

DESCRIPTION OF SPECIFIC EMBODIMENTS OF THE INVENTION

In order to make the purpose, technical solutions and effects of the present disclosure be clear and explicit, the present disclosure will be described in further detail below with reference to the accompanying drawings and embodiments. It should be understood that, the specific embodiments described herein are only used to explain the present disclosure, and are not used to limit the present disclosure.

A gate driver on array (GOA) circuit provided by the present disclosure can be integrated on an array substrate as a row-scanning (Gate) driving circuit in a liquid crystal display to drive pixel switches.

The GOA circuit provided by the present disclosure can be applied to the technical field of driving gate for phones, displays, and televisions.

The GOA circuit provided by the present disclosure can be applied to the technology of row driving in a liquid crystal display (LCD) and an organic light emitting diode (OLED).

The GOA circuit provided by the present disclosure has stability and is suitable for a design of touch and display driver integration (TDDI) with high resolution and/or narrow bezel.

Figure 1:
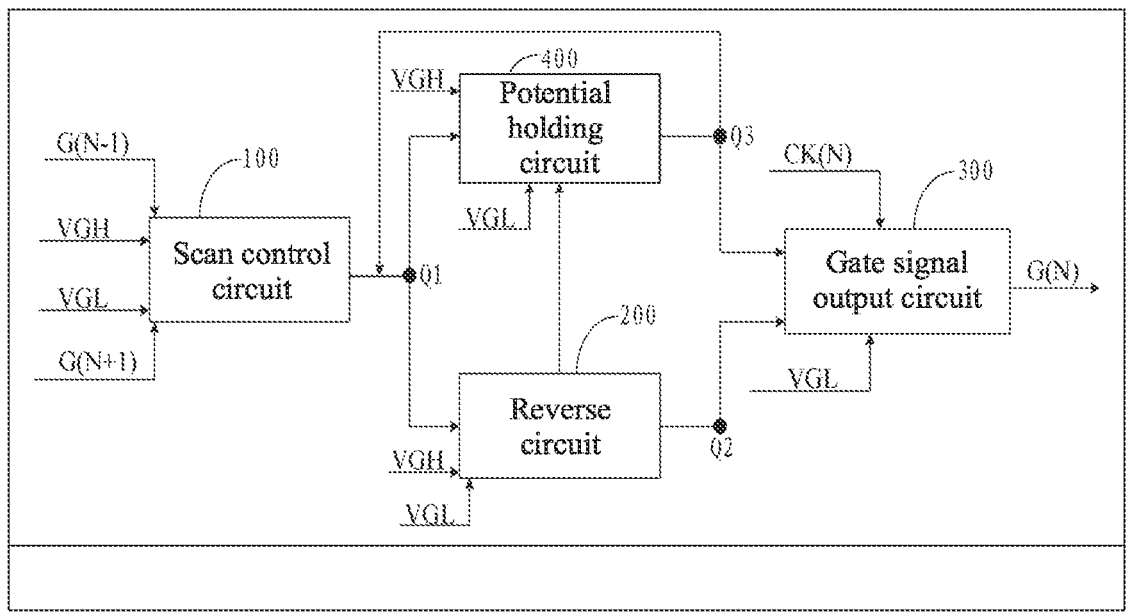
FIG. 1 is a first schematic structural diagram of a gate driver on array (GOA) circuit including an N-th GOA unit of a plurality of GOA units, provided by embodiments of the present disclosure.
Figure 7:
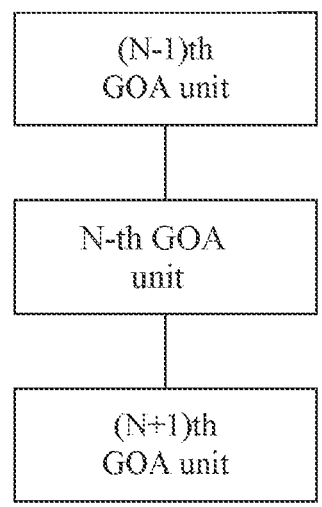
FIG. 7 is a schematic diagram of a GOA circuit including a plurality of cascaded GOA units such as an (N−1)th GOA unit, the N-th GOA unit, and an (N+1)th GOA unit, provided by the embodiments of the present disclosure.

As shown in FIGS. 1 and 7, the present embodiment provides a GOA circuit, which includes a plurality of cascaded GOA units, such as an (N−1)th GOA unit, an N-th GOA unit and an (N+1)th GOA unit, wherein the N-th GOA unit includes a scan control circuit 100, a reverse circuit 200, a gate signal output circuit 300, and a potential holding circuit 400. The scan control circuit 100 is configured to control a first driving signal Q1 being coupled with a constant high-potential voltage signal VGH or a constant low-potential voltage signal VGL according to an (N−1)th gate-driving signal G(N−1) and an (N+1)th gate-driving signal G(N+1). The reverse circuit 200 is coupled to the constant high-potential voltage signal VGH, the constant low-potential voltage signal VGL, and the scan control circuit 100, wherein the reverse circuit 200 is configured to output a second driving signal Q2 according to the first driving signal Q1. The gate signal output circuit 300 is coupled to an N-th clock signal CK(N), the constant low-potential voltage signal VGL, the scan control circuit 100, and the reserve circuit 200, wherein the gate signal output circuit 300 is configured to output an N-th gate-driving signal G(N) according to the first driving signal Q1 and the second driving signal Q2. The potential holding circuit 400 is coupled to the constant high-potential voltage signal VGH, the constant low-potential voltage signal VGL, the scan control circuit 100, the reverse circuit 200, and the gate signal output circuit 300, wherein the potential holding circuit 400 is configured to output a third. driving signal Q3 according to the first driving signal Q1 and the second driving signal Q2, and the third driving signal Q3 is coupled with the first driving signal Q1; and wherein the N is a positive integer.

Specifically, under a case that the scan control circuit 100 is controlled by the (N−1)th gate-driving signal G(N−1) and the (N+1)th gate-driving signal G(N+1), the scan control circuit 100 outputs the first driving signal Q1. The first driving signal Q1 is selectively coupled with the constant high-potential voltage signal VGH or the constant low-potential voltage signal VGL. The reverse circuit 200 outputs the second driving signal Q2 which is at a state of potential opposite to that of the first driving signal Q1, under a case that the reverse circuit 200 is controlled by the first driving signal Q1. The potential holding circuit 400 is controlled by the first driving signal Q1 and the second driving signal Q2. Substantially, the state of potential of the second driving signal Q2 is also controlled by the state of potential of the first driving signal Q1. The potential holding circuit 400 can continuously output the third driving signal Q3 that has a state of potential identical to the first driving signal Q1. A self-feedback loop is formed by coupling the third driving signal Q3 and the first driving signal Q1. The third driving signal Q3 provides a supplement to the potential of the first driving signal Q1. Therefore, when entering a touch phase, even if there is leakage in the GOA circuit, the potential of the first driving signal Q1 can still be maintained until the end of the touch phase, thereby ensuring that the gate signal output circuit 300 can output a normal waveform of the gate-driving signal.

The constant high-potential voltage signal VGH may be, but not limited to, a voltage that turns ON a gate of a thin-film transistor. The constant low-potential voltage signal VGL may be, but not limited to, a voltage that turns OFF a gate of a thin-film transistor.

Figure 2:
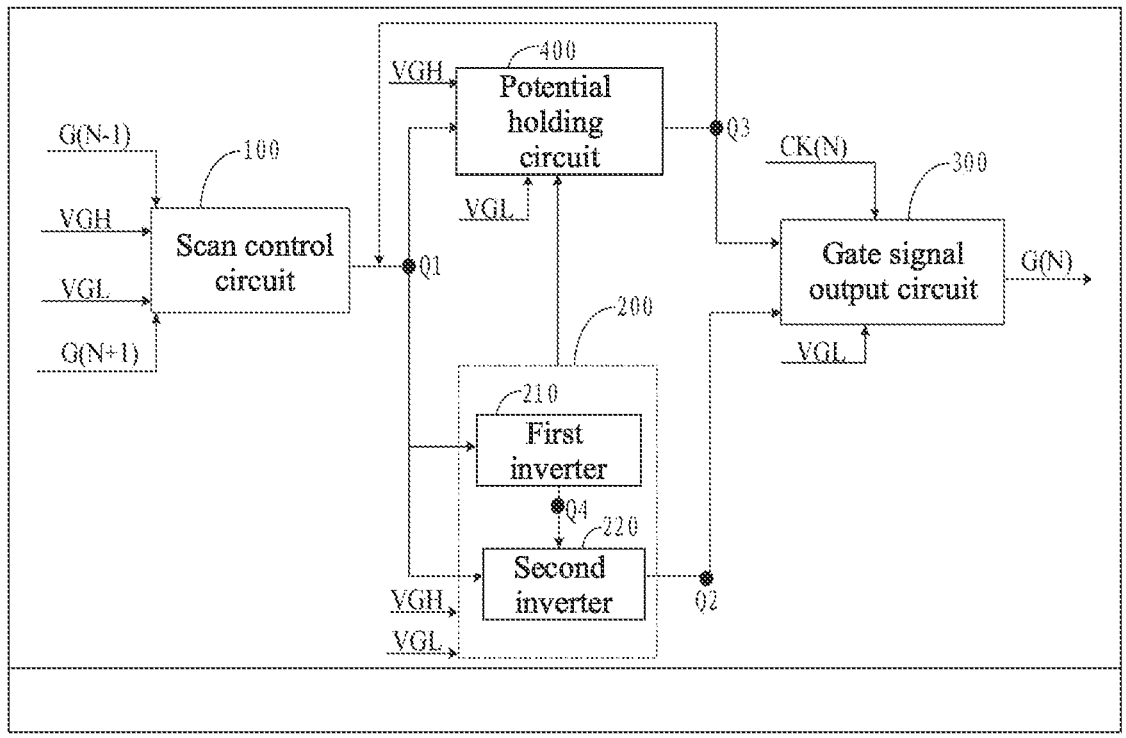
FIG. 2 is a second schematic structural diagram of the GOA circuit including the N-th GOA unit of the plurality of GOA units, provided by the embodiments of the present disclosure.

As shown in FIG. 2, in one of embodiments, the reverse circuit 200 includes a first inverter 210 and a second inverter 220. The first inverter 210 is coupled to the constant high-potential voltage signal VGH, the constant low-potential voltage signal VGL, and the scan control circuit 100, wherein the first inverter 210 is configured to output a fourth driving signal Q4 according to the first driving signal Q1. The second inverter 22 is coupled to the constant high-potential voltage signal VGH, the constant low-potential voltage signal VGL, the scan control circuit 100, and the first inverter 210, wherein the second inverter 220 is configured to output the second driving signal Q2 according to the first driving signal Q1 and the fourth driving signal Q4.

Specifically, the first inverter 210 is controlled by a state of level of the first driving signal Q1, and outputs the fourth driving signal Q4 which is in a state of level opposite to that of the first driving signal Q1. In addition, the second inverter 220 is controlled by a state of level of the first driving signal Q1 and a state of level the fourth driving signal Q4, and outputs the second driving signal Q2 being in a state of level opposite to that of the first driving signal Q1.

Figure 3:
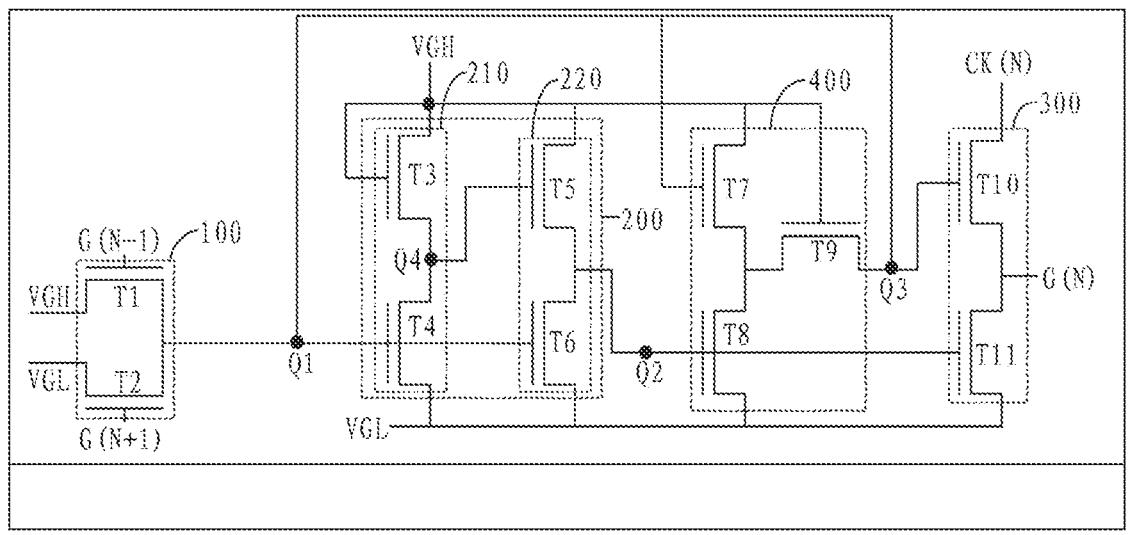
FIG. 3 is a circuit principle diagram of the GOA circuit shown in FIG. 2.

As shown in FIG. 3, in one of embodiments, the scan control circuit 100 includes a first transistor T1 and a second transistor T2. The constant high-potential voltage signal VGH is coupled to a drain of the first transistor T1. The (N−1)th gate-driving signal G(N−1) is coupled to a gate of the first transistor T1. The constant low-potential voltage signal VGL is coupled to a drain of the second transistor T2. The (N+1)th gate-driving signal G(N+1) is coupled to a gate of the second transistor T2. A source of the first transistor T1 and a source of the second transistor T2 are coupled and output the first driving signal Q1.

Specifically, the (N−1)th gate-driving signal G(N−1) controls the first transistor T1 to be turned ON or OFF, in order to control whether the first driving signal Q1 is coupled to a constant high-level voltage signal. When the (N−1)th gate-driving signal G(N−1) is a high level signal, the first transistor T1 is turned ON, and the first driving signal Q1 is coupled to the constant high-level voltage signal. In addition, the (N+1)th gate-driving signal G(N+1) controls the second transistor T2 to be turned ON or OFF, in order to control whether the first driving signal Q1 is coupled to a signal. When the (N+1)th gate-driving signal G(N+1) is a high level signal, the second transistor T2 is turned ON, and the first driving signal Q1 is coupled to the constant low-level voltage signal.

As shown in FIG. 3, the first inverter 210 includes a third transistor T3 and a fourth transistor T4. The constant high-potential voltage signal VGH is coupled to a drain of the third transistor T3 and a gate of the third transistor T3. A source of the third transistor T3 and a drain of the fourth transistor T4 are coupled and output the fourth driving signal Q4. The source of the first transistor T1 is coupled to a gate of the fourth transistor T4. A source of the fourth transistor T4 is coupled to the constant low-potential voltage signal VGL.

Specifically, the gate of the third transistor T3 is controlled by the constant high-potential voltage signal VGH, and is continuously in an ON state. The source of the third transistor T3 also continuously output the constant high-potential voltage signal VGH. In addition, the fourth transistor T4 is controlled by the state of potential of the first driving signal Q1. When the first driving signal Q1 is in a high state of potential, the fourth transistor T4 is in the ON state. At this time, a state of potential of the fourth driving signal Q4 is a low state of potential. When the first driving signal Q1 is in a low state of potential, the fourth transistor T4 is in an OFF state. At this time, the state of potential of the fourth driving signal Q4 is in a high state of potential.

As shown in FIG. 3, in one of embodiments, the second inverter 220 includes a fifth transistor T5 and a sixth transistor T6. The constant high-potential voltage signal VGH is coupled to a drain of the fifth transistor T5. The source of the third transistor T3 is coupled to a gate of the fifth transistor T5. A source of the fifth transistor T5 and a drain of the sixth transistor T6 are coupled and output the second driving signal Q2. The source of the first transistor T1 is coupled to a gate of the sixth transistor T6. The constant low-potential voltage signal VGL is coupled to a source of the sixth transistor T6.

Specifically, the fifth transistor T5 is controlled by the fourth driving signal Q4. The sixth transistor T6 is controlled by the first driving signal Q1. When the first driving signal Q1 is in the high state of potential, the fifth transistor T5 is turned OFF, and the sixth transistor T6 is turned ON. At this time, the second driving signal Q2 is in the low state of potential. When the first driving signal Q1 is in the low state of potential, the fifth transistor T5 is turned ON, and the sixth transistor T6 is turned OFF. At this time, the second driving signal Q2 is in the high state of potential.

As shown in FIG. 3, in one of embodiments, the potential holding circuit 400 includes a seventh transistor T7, an eighth transistor T8, and a ninth transistor T9. The source of the first transistor T1 is coupled to a gate of the seventh transistor T7. The constant high-potential voltage signal VGH is coupled to a drain of the seventh transistor T7 and a gate of the ninth transistor T9. A source of the seventh transistor T7 is coupled to a drain of the ninth transistor T9 and a drain of the eighth transistor T8. The drain of the sixth transistor T6 is coupled to a gate of the eighth transistor T8. The constant low-potential voltage signal VGL is coupled to a source of the eighth transistor T8. A source of the ninth transistor T9 and the source of the first transistor T1 are coupled and output the third driving signal Q3.

Specifically, the seventh transistor T7 is controlled by the first driving signal Q1. The eighth transistor T8 is controlled by the second driving signal Q2. The ninth transistor T9 is controlled by the constant high-potential voltage signal VGH, and is continuously in the ON state, to prevent the source of the ninth transistor T9 from recharging, thereby reducing leakage and making that the potential at the source of the ninth transistor T9 can be maintained for a long time. When the first driving signal Q1 is in the high state of potential, the seventh transistor T7 is turned ON, and the eighth transistor T8 is turned OFF. At this time, the third driving signal Q3 is in the high state of potential. When the first driving signal Q1 is in the low state of potential, the seventh transistor T7 is turned OFF, and the eighth transistor T8 is turned ON. At this time, the third driving signal Q3 is in the low state of potential. Therefore, the state of potential of the third driving signal Q3 and the state of potential of the first driving signal Q1 are always the same. Meanwhile, the third driving signal Q3 and the first driving signal Q1 are electrically connected. During the touch phase, the third driving signal Q3 will maintain the state of potential before entering the touch phase. In addition, a self-feedback loop is formed in the GOA unit to make that the entire GOA unit maintains the state of potential before entering the touch phase, in order to implement for pausing displaying function until the end of the touch phase, so as to continue to display a previous frame.

As shown in FIG. 3, in one of embodiments, the gate signal output circuit 300 includes a tenth transistor T10 and an eleventh transistor T11. The N-th clock signal CK(N) is coupled to a drain of the tenth transistor T10. The source of the ninth transistor T9 is coupled to a gate of the tenth transistor T10. A source of the tenth transistor T10 and a drain of the eleventh transistor T11 are coupled and output the N-th gate-driving signal G(N). The drain of the sixth transistor T6 is coupled to a gate of the eleventh transistor T11. The constant low-potential voltage signal VGL is coupled to a source of the eleventh transistor T11.

Specifically, the tenth transistor T10 is controlled by the first driving signal Q1. The eleventh transistor T11 is controlled by the second driving signal Q2. When the first driving signal Q1 is in the high state of potential, the tenth transistor T10 is turned ON, and the eleventh transistor T11 is turned OFF. At this time, the N-th gate-driving signal G(N) is output as the N-th clock signal CK(N). When the first driving signal Q1 is in the low state of potential, the tenth transistor T10 is turned OFF, and the eleventh transistor T11 is turned ON. At this time, the N-th gate-driving signal G(N) is output as the constant low-potential voltage signal VGL. Since the tenth transistor T10 has a parasitic capacitance itself when the tenth transistor T10 is turned ON, the high level of the N-th clock signal CK(N) can increase the potential at the gate of the tenth transistor T10 based on the bootstrap effect to about twice, so that the tenth transistor T10 is fully turned ON. When the tenth transistor T10 outputs the N-th gate-driving signal G(N), the waveform of the N-th clock signal CK(N) will not be weakened.

As shown in FIG. 3, in one of the embodiments, each of the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, and the eleven transistor T11 is an NMOS thin film transistor.

Specifically, in the present embodiment, the GOA circuit is fully implemented by NMOS thin film transistors. Compared with the GOA circuit implemented by CMOS, when the present GOA circuit is fabricated on a substrate, only a structure of functional layers of NMOS thin film transistors needs to be considered, without a structure of functional layers of PMOS thin film transistors, thereby not only decreasing a number of photomasks, but also simplifying a structure of films of the substrate, wherein the substrate may be, but not limited to, a lower substrate, and also be an upper substrate.

In one of the embodiments, when the N is equal to 1, the (N−1)th gate-driving signal is an enabling signal that is configured to enable a first GOA unit to operate.

Specifically, when the N is equal to 1, the GOA circuit cannot generate the (N−1)th gate-driving signal G(N−1). At this time, a timing controller provides an enabling signal for the GOA circuit to replace the (N−1)th gate-driving signal G(N−1) for enabling the GOA circuit.

Figure 4:
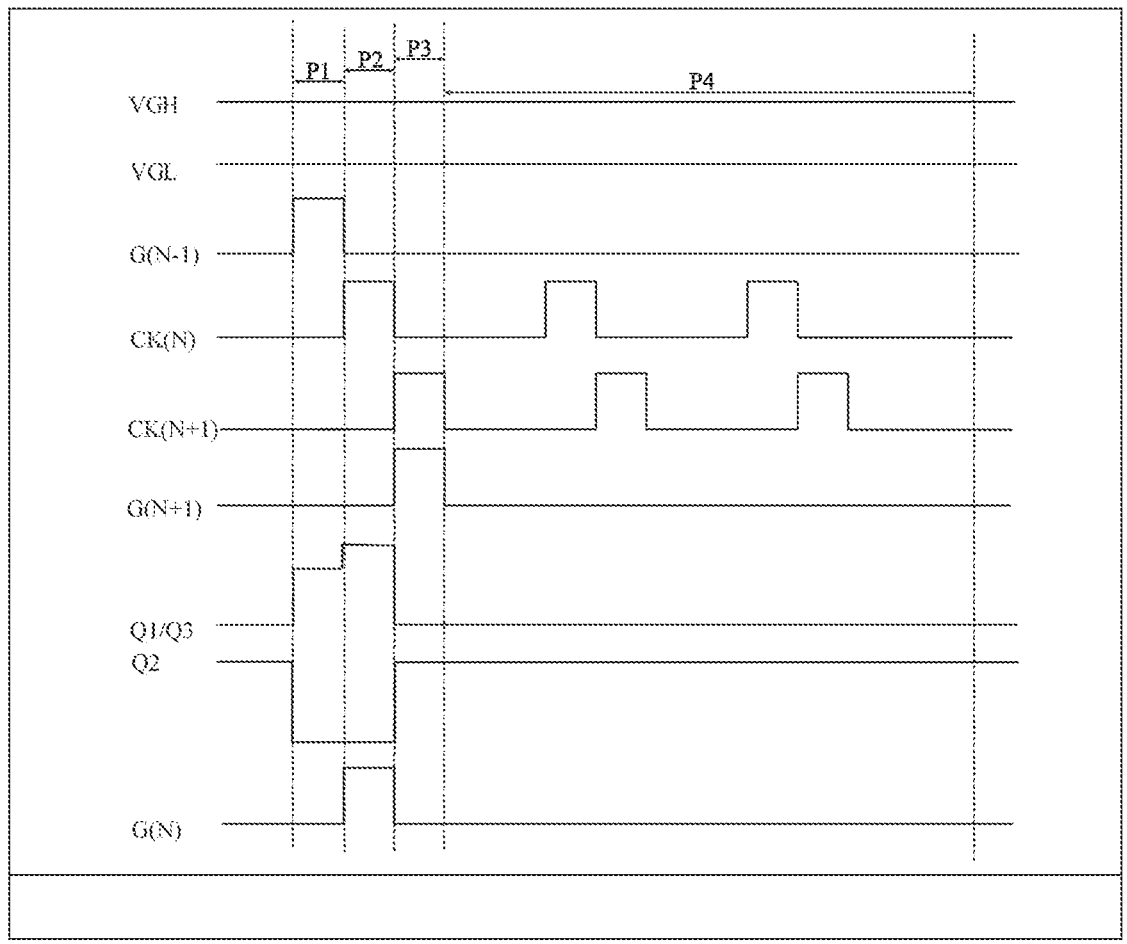
FIG. 4 is a schematic timing diagram of the GOA circuit shown in FIG. 3.

As shown in FIG. 4, in one of embodiments, an operational process of the present disclosure may be divided into several phases as below.

A preset phase P1: in which, when the (N−1)th gate-driving signal G(N−1) is at a high level, the first transistor T1 is turned ON, the first driving signal Q1 is set to the constant high-potential voltage signal VGH, and each of the fourth transistor T4, the sixth transistor T6, and the seventh transistor T7 is in the ON state. When the fourth transistor T4 is turned ON, the fourth driving signal Q4 is dropped to the constant low-potential voltage signal VGL. At this time, the fifth transistor T5 is turned OFF. When the sixth transistor T6 is turned ON, the second driving signal Q2 is dropped, the eighth transistor T8 is turned OFF, the seventh transistor T7 is turned ON, and the gate of the ninth transistor T9 coupled to the constant high-potential voltage signal VGH is in a normally open state. Therefore, the third driving signal Q3 is pulled by the constant high-potential voltage signal VGH via the seventh transistor T7, and the tenth transistor T10 is turned ON.

An output phase P2: in which, when the (N−1)th gate-driving signal G(N−1) is at a low level, the first transistor T1 is turned off. Since the first driving signal Q1 and the third driving signal Q3 are in a self-feedback state, the state of potential of the first driving signal Q1 can be maintained for a long time. At this time, the N-th clock signal CK(N) jumps to a high level, the third driving Q3 will be pulled again due to the bootstrap effect. The tenth transistor T10 is fully turned ON, and the N-th clock signal CK(N) can be output as the N-th gate-driving signal G(N) in a full swing manner.

A reset phase P3: in which, when the (N+1)th gate-driving signal G(N+1) is on a high level, the second transistor T2 is turned ON, the first driving signal Q1 is dropped to the constant low-potential voltage signal VGL. Each of the fourth transistor T4, the sixth transistor Q6, and the seventh transistor T7 is turned OFF, and each of the fifth transistor T5 and the eighth transistor T8 is turned ON. After the fifth transistor T5 is turned ON, the second driving signal Q2 is set to high, each of the eighth transistor TB and the eleventh transistor T11 is turned ON. The N-th gate-driving signal G(N) is dropped to potential identical to the constant low-potential voltage signal VGL. At the same time, the third driving signal Q3 is at the low level, and the tenth transistor T10 is turned OFF.

A holding phase P4: in which, when the (N+1)th gate-driving signal G(N+1) jumps to the low level, each of the first transistor T1 and the second transistor T2 is turned OFF, and the third driving signal Q3 provides a potential supplement to the first driving signal Q1, such that the potential of the first driving signal Q1 can be maintained. The tenth transistor T10 remains in the OFF state, and the second driving signal Q2 remains in the high state of level. The eleventh transistor T11 remains in the ON state, and the Nth gate-driving signal G(N) is dropped to the potential identical to the constant low-potential voltage signal VGL.

Figure 5:
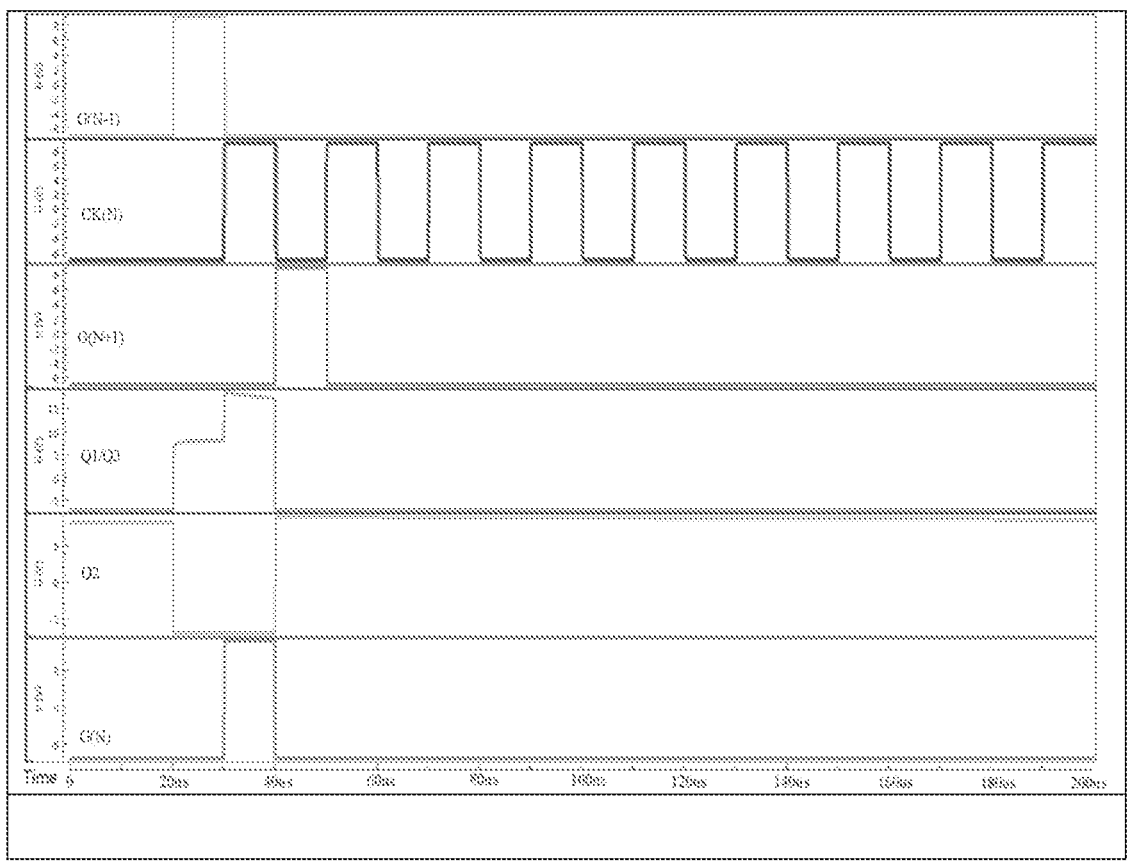
FIG. 5 is a schematic timing diagram of the GOA circuit, operating for 200 us during a touch phase, provided by the embodiments of the present disclosure.

As shown in FIG. 5, a simulation result of the GOA circuit proposed in the present disclosure during a 200 us period is provided. Combining the operational phases shown in FIG. 4, it can be concluded that the GOA circuit is continuously maintained to 200 us during the holding phase P4. The waveforms of the first driving signal Q1, the second driving signal Q2, and the third driving signal Q3 are continuously maintained.

Figure 6:
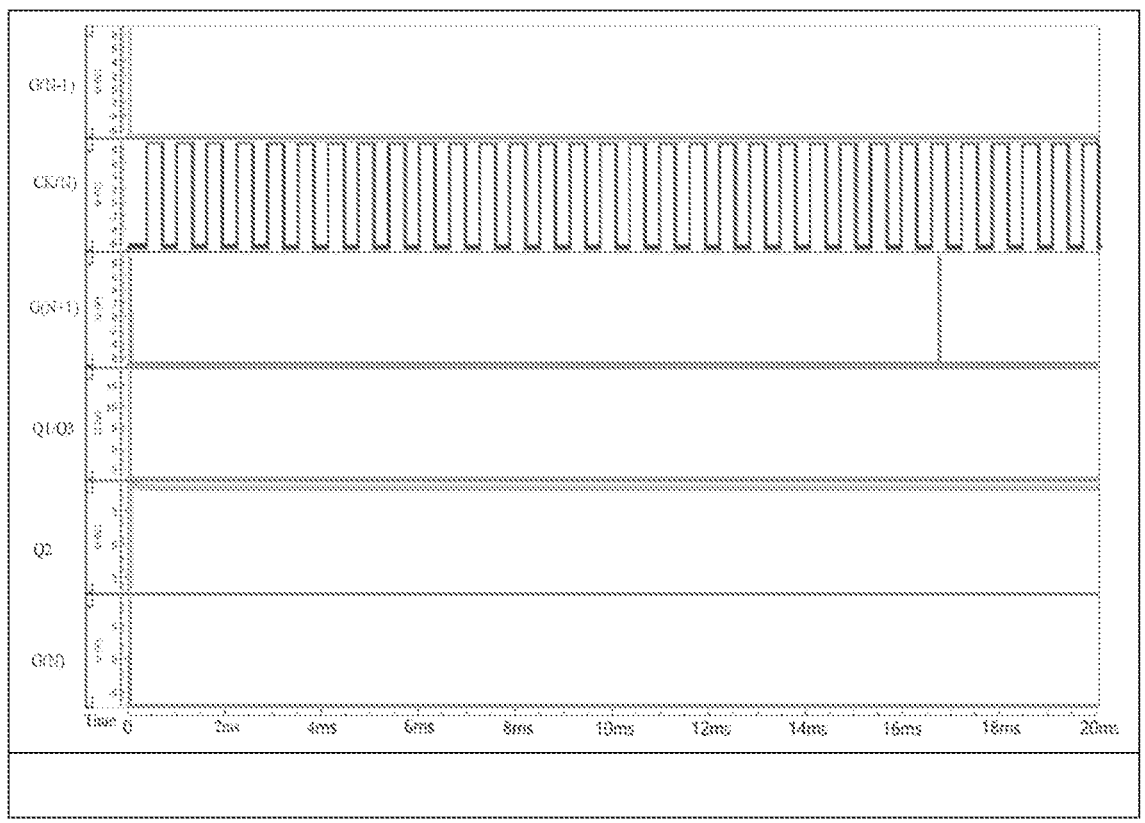
FIG. 6 is a schematic timing diagram of the GOA circuit, operating for 20 ms during a touch phase, provided by the embodiments of the present disclosure.

As shown in FIG. 6, a simulation result of the GOA circuit proposed in the present disclosure during a 20 ms period is provided. Combining the operational phases shown in FIG. 4, it can be concluded that the GOA circuit can be continuously maintained to 20 ms after the touch phase starts. The waveforms of the first driving signal Q1, the second driving signal Q2, and the third driving signal Q3 are continuously maintained.

Combining FIGS. 5 and 6, the GOA circuit provided by the present disclosure, during the touch phase or a touch-controlling phase, the state of potential of the first driving signal Q1, the state of potential of the second driving signal Q2, and the state of potential of the third driving signal Q3 can be maintained until the end of the touch-controlling phase, thereby being able to well meet the needs of TDDI panels for touch and display functions.

In one of embodiments, the present disclosure provides a display panel, which includes a GOA circuit in any one of the above embodiments.

Specifically, the GOA circuit can be used to drive pixel switches in the display panel. The GOA circuit may be, but not limited to, disposed within a bezel region, which is either a bezel region of an upper substrate, or a bezel region of a lower substrate.

It can be understood that, for those of ordinary skill in the art, equivalent replacements or changes can be made according to the technical solutions and inventive concepts of the present disclosure, and all such changes or replacements should fall within the protection scope of the claims appended to the present disclosure.

What is claimed is:

1. A gate driver on array (GOA) circuit, comprising a plurality of cascaded GOA units, wherein an N-th GOA unit comprises:
    a scan control circuit comprising two transistors coupled and configured to control a first driving signal being coupled with a constant high-potential voltage signal or a constant low-potential voltage signal according to an (N−1)th gate-driving signal and an (N+1)th gate-driving signal;
    a reverse circuit coupled to the constant high-potential voltage signal, the constant low-potential voltage signal, and the scan control circuit, wherein the reverse circuit comprises two inverters coupled and configured to output a second driving signal according to the first driving signal;
    a gate signal output circuit coupled to an N-th clock signal, the constant low-potential voltage signal, the scan control circuit, and the reverse circuit, wherein the gate signal output circuit comprises two transistors coupled and configured to output an N-th gate-driving signal according to the first driving signal and the second driving signal; and
    a potential holding circuit coupled to the constant high-potential voltage signal, the constant low-potential voltage signal, the scan control circuit, the reverse circuit, and the gate signal output circuit, wherein the potential holding circuit comprises three transistors coupled and configured to output a third driving signal according to the first driving signal and the second driving signal, and the third driving signal is coupled with the first driving signal;
    wherein the N is a positive integer.

2. The GOA circuit as claimed in claim 1, wherein the reverse circuit comprises:
    a first inverter coupled to the constant high-potential voltage signal, the constant low-potential voltage signal, and the scan control circuit, wherein the first inverter comprises two transistors coupled and, configured to output a fourth driving signal according to the first driving signal; and
    a second inverter coupled to the constant high-potential voltage signal, the constant low-potential voltage signal, the scan control circuit, and the first inverter, wherein the second inverter comprises two transistors coupled and configured to output the second driving signal according to the first driving signal and the fourth driving signal.

3. The GOA circuit as claimed in claim 2, wherein the scan control circuit comprises a first transistor and a second transistor;
    wherein the constant high-potential voltage signal is coupled to a drain of the first transistor; the (N−1)th gate-driving signal is coupled to a gate of the first transistor; the constant low-potential voltage signal is coupled to a drain of the second transistor; the (N+1)th gate-driving signal is coupled to a gate of the second transistor; and a source of the first transistor and a source of the second transistor are coupled and output the first driving signal.

4. The GOA circuit as claimed in claim 3, wherein the first inverter comprises a third transistor and a fourth transistor;
    wherein the constant high-potential voltage signal is coupled to a drain of the third transistor and a gate of the third transistor; a source of the third transistor and a drain of the fourth transistor are coupled and output the fourth driving signal; the source of the first transistor is coupled to a gate of the fourth transistor; and a source of the fourth transistor is coupled to the constant low-potential voltage signal.

5. The GOA circuit as claimed in claim 4, wherein the second inverter comprises a fifth transistor and a sixth transistor;
    wherein the constant high-potential voltage signal is coupled to a drain of the fifth transistor; the source of the third transistor is coupled to a gate of the fifth transistor; a source of the fifth transistor and a drain of the sixth transistor are coupled and output the second driving signal; the source of the first transistor is coupled to a gate of the sixth transistor; and the constant low-potential voltage signal is coupled to a source of the sixth transistor.

6. The GOA circuit as claimed in claim 5, wherein the potential holding circuit comprises a seventh transistor, an eighth transistor, and a ninth transistor;
    wherein the source of the first transistor is coupled to a gate of the seventh transistor; the constant high-potential voltage signal is coupled to a drain of the seventh transistor and a gate of the ninth transistor; a source of the seventh transistor is coupled to a drain of the ninth transistor and a drain of the eighth transistor; the drain of the sixth transistor is coupled to a gate of the eighth transistor; the constant low-potential voltage signal is coupled to a source of the eighth transistor; and a source of the ninth transistor and the source of the first transistor are coupled and output the third driving signal.

7. The GOA circuit as claimed in claim 6, wherein the gate signal output circuit comprises a tenth transistor and an eleventh transistor;
    wherein the N-th clock signal is coupled to a drain of the tenth transistor; the source of the ninth transistor is coupled to a gate of the tenth transistor; a source of the tenth transistor and a drain of the eleventh transistor are coupled and output the N-th gate-driving signal; the drain of the sixth transistor is coupled to a gate of the eleventh transistor; and the constant low-potential voltage signal is coupled to a source of the eleventh transistor.

8. The GOA circuit as claimed in claim 7, wherein each of the first transistor, the second transistor, the third transistor, the fourth transistor, the fifth transistor, the sixth transistor, the seventh transistor, the eighth transistor, the ninth transistor, the tenth transistor, and the eleven transistor is an NMOS thin film transistor.

9. A gate driver on array (GOA) circuit, comprising a plurality of cascaded GOA units, wherein an N-th GOA unit comprises:
- a scan control circuit comprising two transistors coupled and configured to control a first driving signal being coupled with a constant high-potential voltage signal or a constant low-potential voltage signal according to an (N−1)th gate-driving signal and an (N+1)th gate-driving signal;
- a reverse circuit coupled to the constant high-potential voltage signal, the constant low-potential voltage signal, and the scan control circuit, wherein the reverse circuit comprises two inverters coupled and configured to output a second driving signal according to the first driving signal;
- a gate signal output circuit coupled to an N-th clock signal, the constant low-potential voltage signal, the scan control circuit, and the reverse circuit, wherein the gate signal output circuit comprises two transistors coupled and configured to output an N-th gate-driving signal according to the first driving signal and the second driving signal; and
- a potential holding circuit coupled to the constant high-potential voltage signal, the constant low-potential voltage signal, the scan control circuit, the reverse circuit, and the gate signal output circuit, wherein the potential holding circuit comprises three transistors coupled and configured to output a third driving signal according to the first driving signal and the second driving signal, and the third driving signal is coupled with the first driving signal;
- wherein the N is a positive integer; when the N is equal to 1, the (N−1)th gate-driving signal is an enabling signal that is configured to enable a first GOA unit to operate.

10. The GOA circuit as claimed in claim 9, wherein the reverse circuit comprises:
- a first inverter coupled to the constant high-potential voltage signal, the constant low-potential voltage signal, and the scan control circuit, wherein the first inverter comprises two transistors coupled and configured to output a fourth driving signal according to the first driving signal; and
- a second inverter coupled to the constant high-potential voltage signal, the constant low-potential voltage signal, the scan control circuit, and the first inverter, wherein the second inverter comprises two transistors coupled and configured to output the second driving signal according to the first driving signal and the fourth driving signal.

11. The GOA circuit as claimed in claim 10, wherein the scan control circuit comprises a first transistor and a second transistor;
- wherein the constant high-potential voltage signal is coupled to a drain of the first transistor; the (N−1)th gate-driving signal is coupled to a gate of the first transistor; the constant low-potential voltage signal is coupled to a drain of the second transistor; the (N+1)th gate-driving signal is coupled to a gate of the second transistor; and a source of the first transistor and a source of the second transistor are coupled and output the first driving signal.

12. The GOA circuit as claimed in claim 11, Therein the first inverter comprises a third transistor and a fourth transistor;
- wherein the constant high-potential voltage signal is coupled to a drain of the third transistor and a gate of the third transistor; a source of the third transistor and a drain of the fourth transistor are coupled and output the fourth driving signal; the source of the first transistor is coupled to a gate of the fourth transistor; and a source of the fourth transistor is coupled to the constant low-potential voltage signal.

13. The GOA circuit as claimed in claim 12, wherein the second inverter comprises a fifth transistor and a sixth transistor;
- wherein the constant high-potential voltage signal is coupled to a drain of the fifth transistor; the source of the third transistor is coupled to a gate of the fifth transistor; a source of the fifth transistor and a drain of the sixth transistor are coupled and output the second driving signal; the source of the first transistor is coupled to a gate of the sixth transistor; and the constant low-potential voltage signal is coupled to a source of the sixth transistor.

14. The GOA circuit as claimed in claim 13, wherein the potential holding circuit comprises a seventh transistor, an eighth transistor, and a ninth transistor;
- wherein the source of the first transistor is coupled to a gate of the seventh transistor;
- the constant high-potential voltage signal is coupled to a drain of the seventh transistor and a gate of the ninth transistor; a source of the seventh transistor is coupled to a drain of the ninth transistor and a drain of the eighth transistor; the drain of the sixth transistor is coupled to a gate of the eighth transistor; the constant low-potential voltage signal is coupled to a source of the eighth transistor; and a source of the ninth transistor and the source of the first transistor are coupled and output the third driving signal.

15. The GOA circuit as claimed in claim 14, wherein the gate signal output circuit comprises a tenth transistor and an eleventh transistor;
- wherein the N-th clock signal is coupled to a drain of the tenth transistor; the source of the ninth transistor is coupled to a gate of the tenth transistor; a source of the tenth transistor and a drain of the eleventh transistor are coupled and output the N-th gate-driving signal; the drain of the sixth transistor is coupled to a gate of the eleventh transistor; and the constant low-potential voltage signal is coupled to a source of the eleventh transistor.

16. The GOA circuit as claimed in claim 15, wherein each of the first transistor, the second transistor, the third transistor, the fourth transistor, the fifth transistor, the sixth transistor, the seventh transistor, the eighth transistor, the ninth transistor, the tenth transistor, and the eleven transistor is an NMOS thin film transistor.

17. A display panel, comprising a gate driver on array (GOA) circuit, which comprises a plurality of cascaded GOA units, wherein an N-th GOA unit comprises:
- a scan control circuit comprising two transistors coupled and configured to control a first driving signal being coupled with a constant high-potential voltage signal or a constant low-potential voltage signal according to an (N−1)th gate-driving signal and an (N+1)th gate-driving signal;

a reverse circuit coupled to the constant high-potential voltage signal, the constant low-potential voltage signal, and the scan control circuit, wherein the reverse circuit comprises two inverters coupled and configured to output a second driving signal according to the first driving signal;

a gate signal output circuit coupled to an N-th clock signal, the constant low-potential voltage signal, the scan control circuit, and the reverse circuit, wherein the gate signal output circuit comprises two transistors coupled and configured to output an N-th gate-driving signal according to the first driving signal and the second driving signal; and a potential holding circuit coupled to the constant high-potential voltage signal, the constant low-potential voltage signal, the scan control circuit, the reverse circuit, and the gate signal output circuit, wherein the potential holding circuit comprises three transistors coupled and configured to output a third driving signal according to the first driving signal and the second driving signal, and the third driving signal is coupled with the first driving signal;

wherein the N is a positive integer.

* * * * *

UNITED STATES PATENT AND TRADEMARK OFFICE
CERTIFICATE OF CORRECTION

PATENT NO. : 11,322,108 B2
APPLICATION NO. : 16/766748
DATED : May 3, 2022
INVENTOR(S) : Jian Tao Page 1 of 1

It is certified that error appears in the above-identified patent and that said Letters Patent is hereby corrected as shown below:

On the Title Page

Item [73], Assignee:
"Wuhan China Star Optoelectronies Technology Co., Ltd."

Should be changed to:
--Wuhan China Star Optoelectronics Technology Co., Ltd.--

Signed and Sealed this
Thirteenth Day of December, 2022

*Katherine Kelly Vidal*

Katherine Kelly Vidal
*Director of the United States Patent and Trademark Office*